United States Patent [19]

Lade et al.

[11] Patent Number: 4,574,209
[45] Date of Patent: Mar. 4, 1986

[54] SPLIT GATE EFET AND CIRCUITRY

[75] Inventors: Robert W. Lade, Fort Myers, Fla.; Herman P. Schutten, Milwaukee; James A. Benjamin, Waukesha, both of Wis.

[73] Assignee: Eaton Corporation, Cleveland, Ohio

[21] Appl. No.: 390,562

[22] Filed: Jun. 21, 1982

[51] Int. Cl.[4] .......................................... H03K 17/687
[52] U.S. Cl. ..................................... 307/577; 307/584; 357/23.4; 357/23.8; 357/23.14; 357/39; 357/43; 357/86
[58] Field of Search .............. 357/23 VD, 23 HV, 59, 357/41, 43, 86, 39, 23.4, 8, 14; 307/577, 584

[56] References Cited

U.S. PATENT DOCUMENTS

| | | | |
|---|---|---|---|
| 4,072,975 | 2/1978 | Ishitani | 357/55 |
| 4,152,714 | 5/1979 | Henerickson et al. | 357/41 |
| 4,172,260 | 10/1979 | Okabe et al. | 357/23 HV |
| 4,199,774 | 4/1980 | Plummer | 357/23 VD |
| 4,414,560 | 11/1983 | Lidow | 357/23 VD |

OTHER PUBLICATIONS

J. Tihanyi, "Funct. Integ. of Power MOS and Bipolar Devices," Proc. 1980 IEEE IEDM Conf., Dec. 1980, pp. 75–78.
"A Parametric Study of Power MOSFETs", C. Hu, IEEE Electron Device Conference; Paper CH 1461-3/79, 0000-0385.
IEEE Transactions Electron Devices, vol. Ed-25; #10; Oct., 1978.
"UMOS Transistors on (110) Silicon", Ammar & Rogers Transactions IEEE; Ed-27; May, 1980; pp. 907–914.

Primary Examiner—Joseph E. Clawson, Jr.
Attorney, Agent, or Firm—Andrus, Sceales, Starke & Sawall

[57] ABSTRACT

Lateral FET structure is disclosed for bidirectional power switching. A split gate structure is provided to prevent unwanted formation of potential conduction channels in the OFF state of the FET. This enables the gate to be referenced in common to one of the source regions in the OFF state while still affording high blocking voltage capability. A multicell matrix array is also disclosed.

6 Claims, 16 Drawing Figures

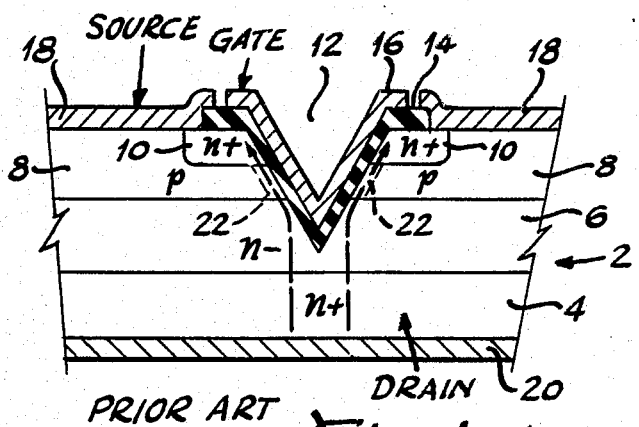
Fig. 1 VMOS FET PRIOR ART
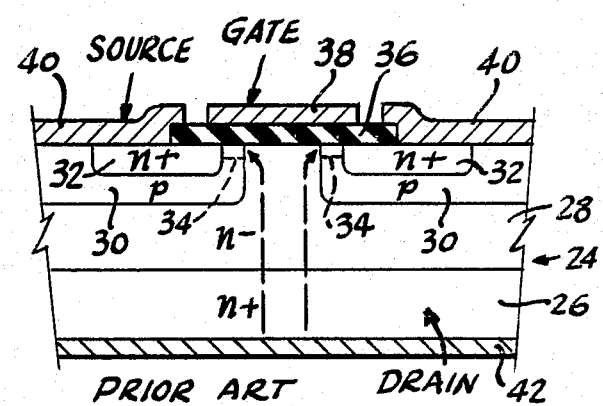
DMOS FET PRIOR ART Fig. 2
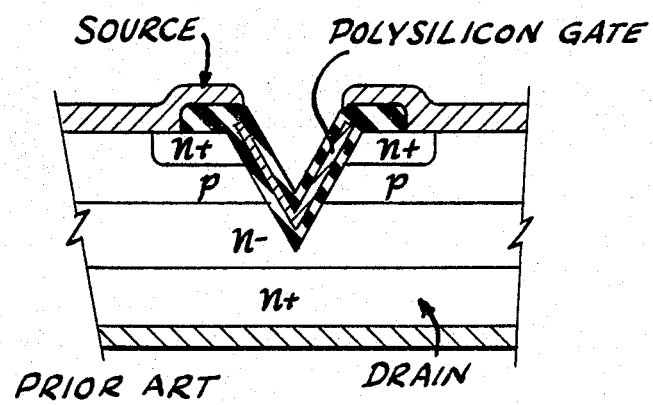
Fig. 3 VMOS WITH POLY-SI GATE PRIOR ART

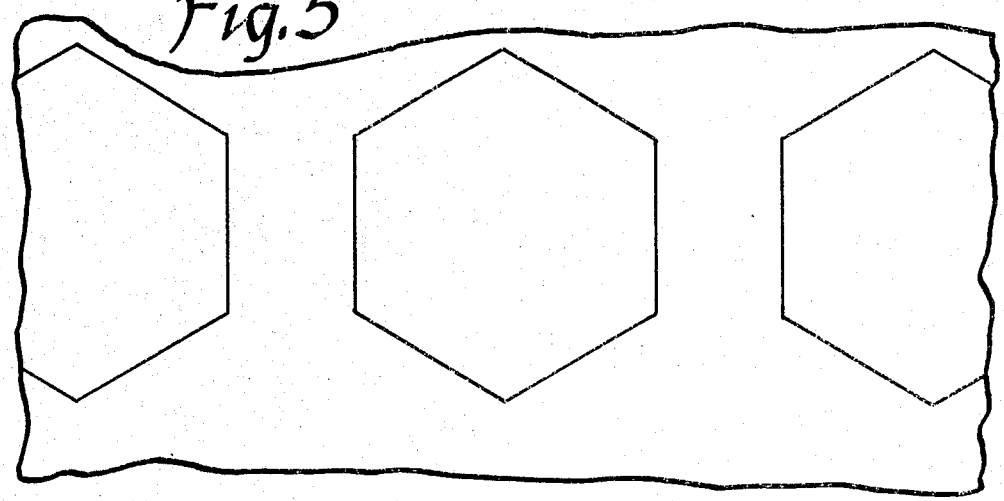
Fig. 5
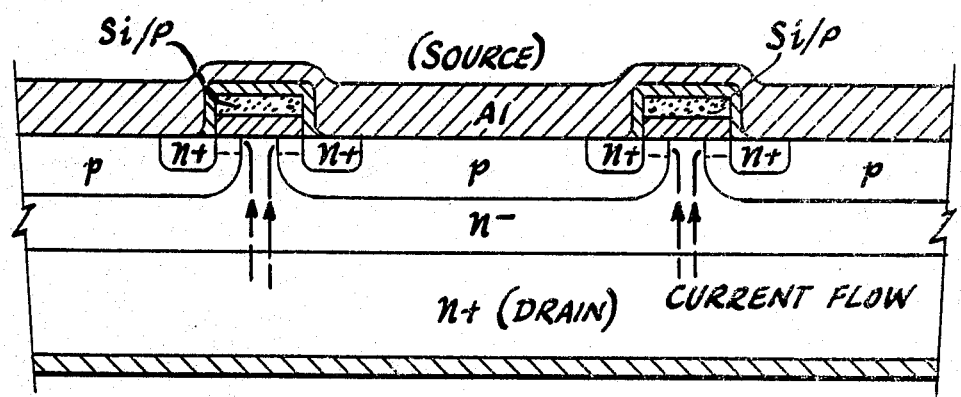
Fig. 4  PRIOR ART DMOS WITH POLY-SI GATE (HEX FET)
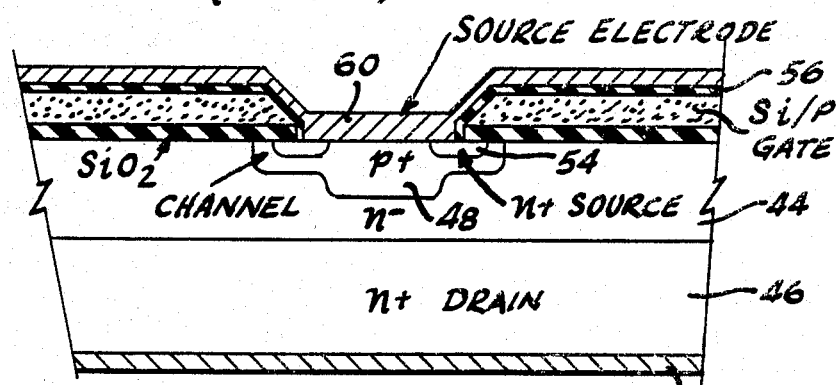
Fig. 6  PRIOR ART SIPMOS FET

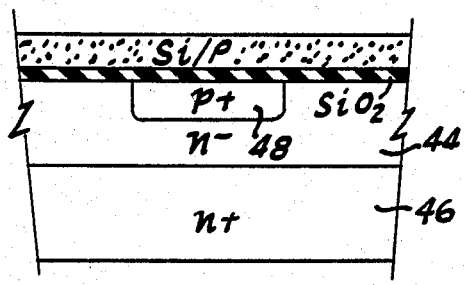
Fig. 7 PRIOR ART
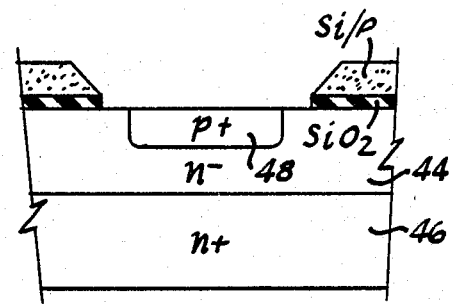
Fig. 8 PRIOR ART
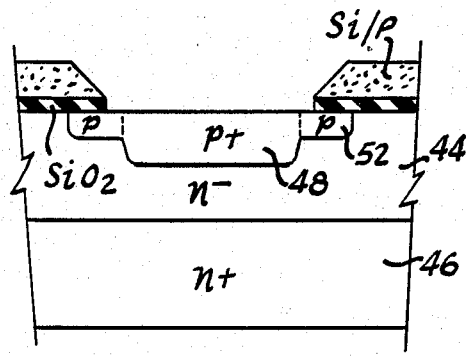
Fig. 9 PRIOR ART
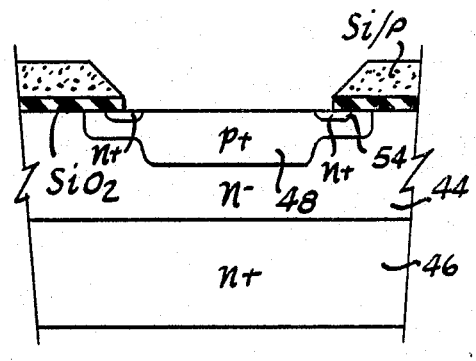
Fig. 10 PRIOR ART
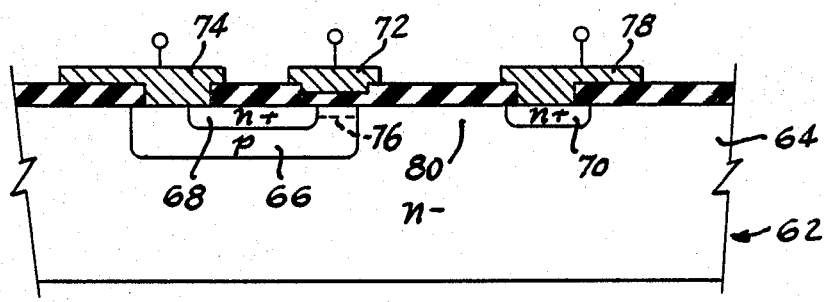
Fig. 11 PRIOR ART LATERAL MOSFET

SPLIT GATE EFET AND CIRCUITRY

TECHNICAL FIELD

The invention relates to power switching semiconductors, and more particularly to power MOSFETs (metal oxide semiconductor field effect transistors), and the like.

BACKGROUND

The present invention evolved from efforts to develop a solid state device for high power switching applications to replace the low current circuit breaker or contactor, though the invention is of course not limited thereto. Performance requirements for such a device are demanding, and even modest specifications might include a 400 volt blocking capability with a corresponding ON state resistance of 0.05 ohms and an AC current rating of 20 amps rms. Further, the system should be capable of interrupting a fault current of 5,000 amps without destroying itself. Additionally, manufacturing cost should be less than or equal to the circuit breaker or contactor cost.

High power switching in solid state devices has evolved over the last 30 years from the early milliwatt devices to the present kilowatt "hockey puck" thyristor devices. Device processing has evolved from the early restrictive alloy/rate grown devices to planar and MOS VLSI structures, bringing the blocking voltages of switches from the 10 volt level of the 1950's to the kilovolt range today. Even with these great strides, however, the problem of developing a semiconductor device to replace the low current circuit breaker or contactor has remained unsolved.

There are three likely candidates for high power switching applications. Two of these are bipolar, i.e. they depend on the flow of two types of carriers, majority and minority. The third is unipolar, i.e. it depends only on majority carrier current flow.

The first two candidates are the thyristor and the bipolar transistor. Although the thyristor is capable of blocking a high reverse voltage, it can be characterized in the forward ON state by a fixed voltage source (one junction drop) and a resistance with a negative temperature coefficient, i.e., resistance decreases with increasing temperature. The bipolar transistor can be characterized in the forward ON state simply as a resistance with a negative temperature coefficient. In each case, it is extremely difficult to accommodate large current ratings through the paralleling of bipolar devices due to the effect of "current hogging". If a number of these devices are paralleled, and if one unit draws slightly more current than the others, it will heat up and its resistance will be reduced. This results in a still larger share of the current, further heating, etc. The result is usually the thermal destruction of that device and the subsequent overloading of the others. In general, current hogging prevents paralleling of these devices unless ballast resistance, a form of stabilizing negative feedback, is introduced. This resistance further adds to the total ON state resistance and is therefore highly undesirable. Other disadvantages are false dv/dt triggering of thyristors, and secondary breakdown problems in bipolar transistors.

The third candidate, the field effect transistor (FET), is exclusively a majority carrier device. Its resistance is related to temperature through the electron mobility. Its resistance has a positive temperature coefficient, namely the resistance is proportional to $T^{3/2}$. Since the electron mobility is 2.5 times greater than the hole mobility in silicon, the n channel device leads to lower ON state resistance. Further, since MOS devices give conductivity enhancement in the ON state, these devices are generally more conductive than their junction depletion-mode counterparts (JFET). Additionally, since minimal channel length (for low ON state resistance) and high packing densities are desirable, the vertical power MOSFET presently is leading all others in the power switching field.

Current commercially available MOSFETs have performance specifications approximately one order of magnitude below the minimal requirements noted above. Two current designs are the SIPMOS device and the HEXFET device, discussed more fully hereinafter.

SUMMARY

The present invention provides lateral power FET structure which is bidirectional, i.e. current can flow in either direction when the device is in the ON state, whereby to afford AC application.

A split gate electrode structure is provided to afford increased OFF state voltage blocking capability, including non-floating gate implementations.

Right and left laterally spaced source regions and channel regions have a drift region current path therebetween. Split gate electrode structure provides separate gate electrodes for each channel, without continuous electrode extension adjacent the drift region. This prevents induced conductivity inversion along the drift region beneath a top major surface during the OFF state.

In a desirable aspect, the structure is suited to manufacture in a repetitive multi-cell matrix array, affording plural FET integrated structure.

BRIEF DESCRIPTION OF THE DRAWINGS

Prior Art

FIGS. 1 through 11 show prior art.

FIG. 1 is a schematic cross-sectional view of a VMOS FET.

FIG. 2 is a schematic cross-sectional view of a DMOS FET.

FIG. 3 is a schematic cross-sectional view of a VMOS FET with a polysilicon gate.

FIG. 4 is a schematic cross-sectional view of a DMOS FET with a polysilicon gate (HEXFET).

FIG. 5 shows a top view of the structure of FIG. 4, illustrating the HEX outline.

FIG. 6 is a schematic cross-sectional view of a SIPMOS FET.

FIGS. 7–10 schematically illustrate the process steps yielding the structure of FIG. 6.

FIG. 11 is a schematic cross-sectional view of a lateral MOSFET.

Present Invention

FIGS. 12 through 16 illustrate the present invention.

Figure 12:
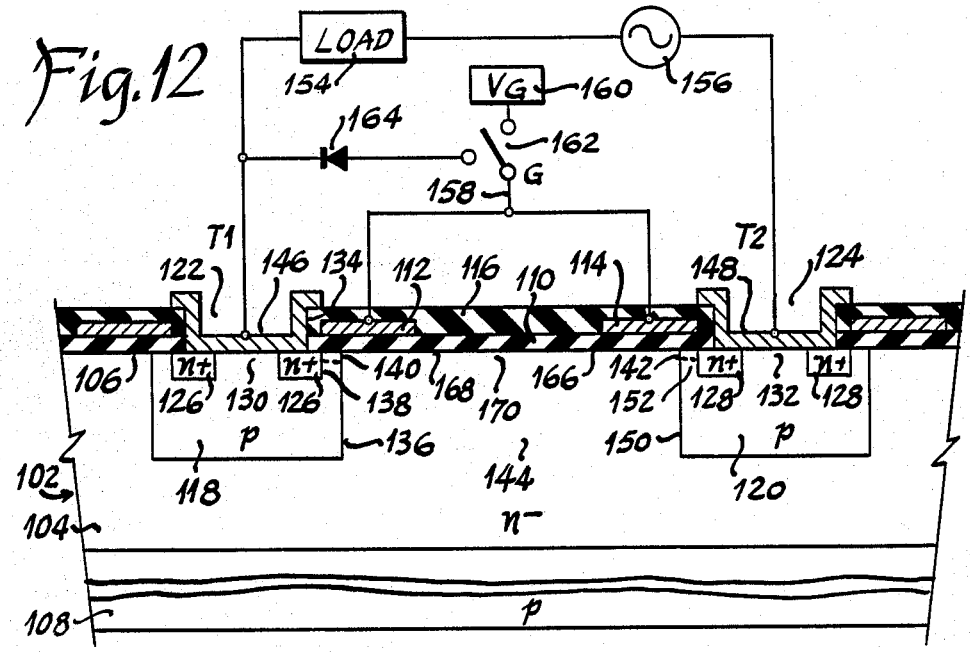

FIG. 12 is a schematic sectiontal view of split gate lateral bidirectional power FET structure constructed in accordance with the invention, called Split Gate EFET.

Figure 13:
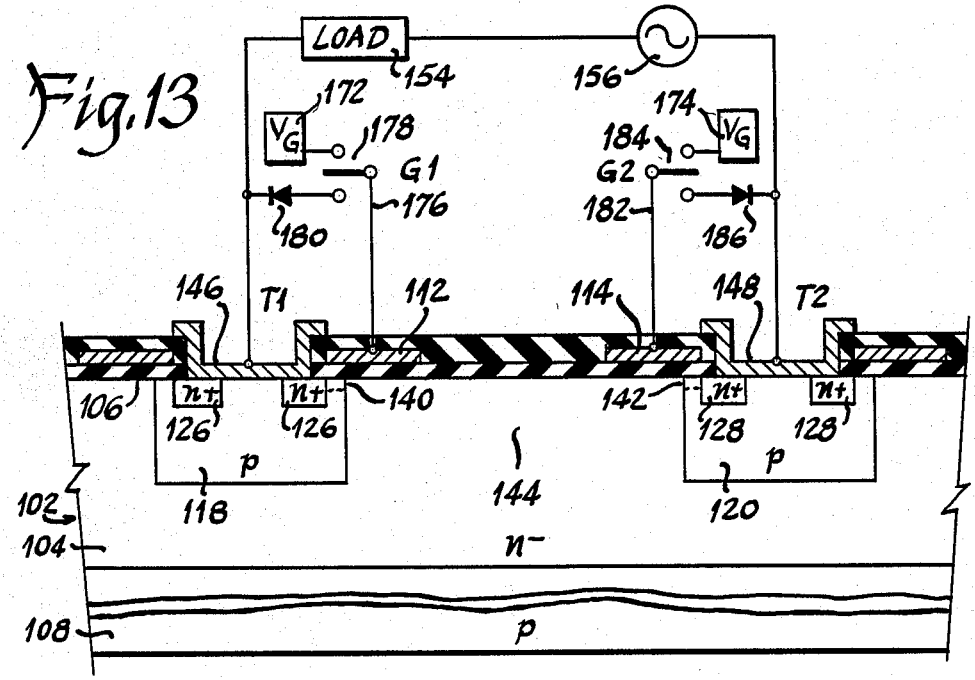

FIG. 13 is a view like FIG. 12 and schematically shows an alternate gating arrangement.

Figure 14:
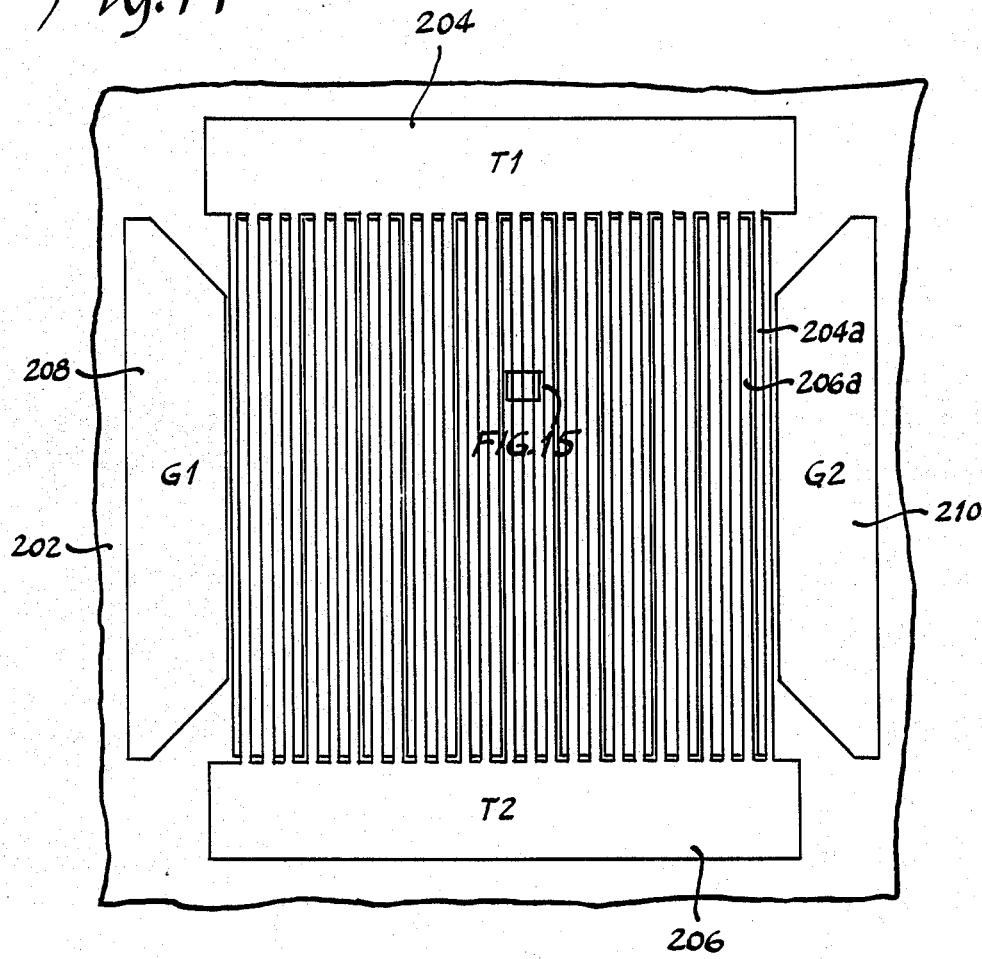

FIG. 14 is a schematic top view of a semiconductor chip having a plurality of split gate lateral bidirectional FETs integrated theron in a matrix array.

Figure 15:
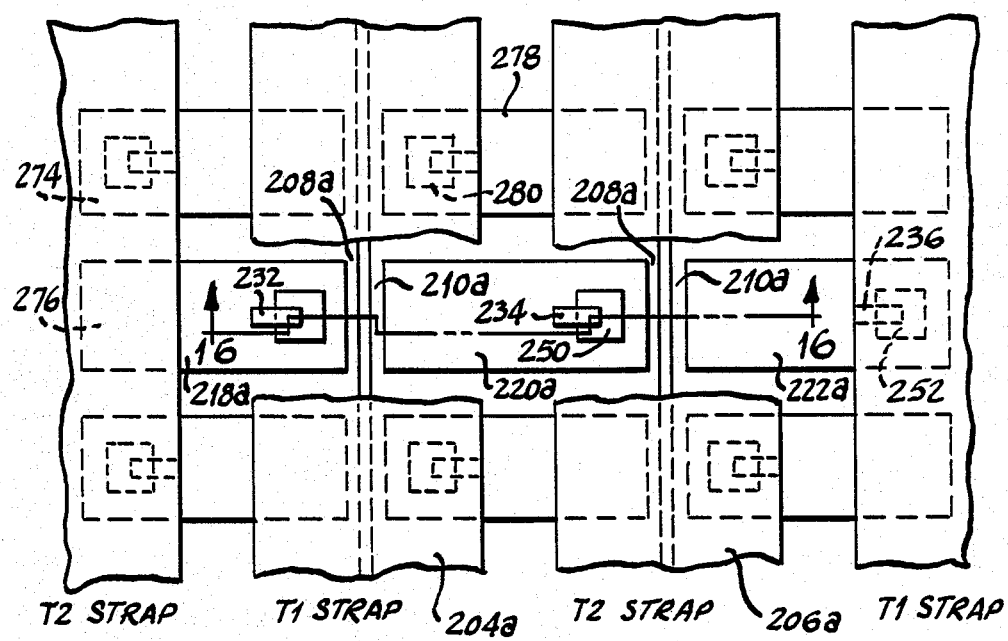

FIG. 15 is an enlarged view of the correspondingly outlined section of FIG. 14.

Figure 16:
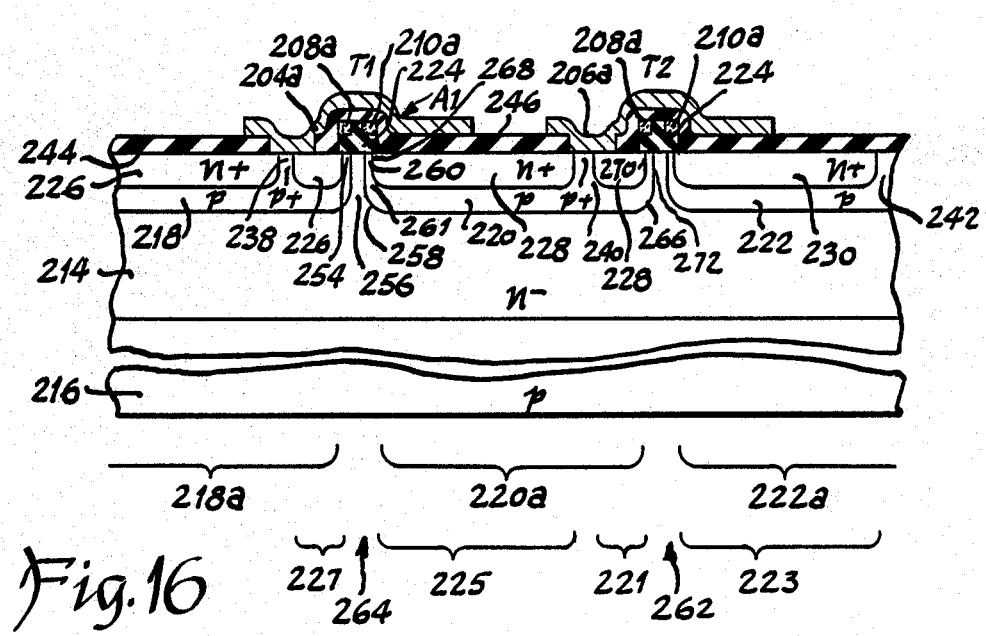

FIG. 16 is a cross-sectional view taken along line 16—16 in FIG. 15.

DESCRIPTION OF PRIOR ART AND POWER MOSFET TECHNOLOGY

MOSFETs can generally be classified into two groupings according to the principle orientation of current flow, namely vertical and lateral. For the vertical units, there are two predominant geometries: planar (HEXFET, TMOS, SIPMOS, etc.); and non-planar (VMOS, UMOS, etc.). The advantage that these devices enjoy over their lateral counterparts is that the drain contact is placed on the bottom of the chip. Thus, for a given chip area, higher current ratings (higher packing densities) are possible. As a consequence, almost all power MOSFET design has been concentrated on vertical configurations.

A cross-sectional view of a typical non-planar vertical device is illustrated in FIG. 1, showing a VMOS structure 2. The starting material is an n+ silicon wafer 4 with an n- epitaxial layer 6. Successive p and n+ diffusions are carried out, yielding layers 8 and 10. A groove is anisotropically etched to yield V-groove 12. An insulating oxide layer 14 is formed in the groove, followed by deposition of gate metalization 16. Source metalization 18 is deposited on the top major surface, and drain electrode metalization 20 is deposited on the bottom major surface.

FET channel 22 is through p region 8 along the edge of the V-groove. Upon application of a positive voltage on gate electrode 16 relative to source electrode 18, electrons in p region 8 are attracted into channel 22 to invert the conductivity type of the channel to n type. Electrons may then flow from source region 10 through channel 22 to drain region 4, and hence current may flow from drain electrode 20 through drain region 4 through channel 22 through source region 10 to source electrode 18.

One of the main advantages of the VMOS design is that the active channel length is extremely small and is determined by the difference in depth between the n+ source diffusion 10 and the p body diffusion 8. The technology in diffusion is sufficiently well advanced so that this dimension can be very tightly controlled. Thus the channel resistance can be closely held to a maximum specification.

One type of VMOS or UMOS (truncated VMOS) design is the notched MOSFET structure, for example "A Parametric Study of Power MOSFETs", C. Hu, IEEE Electron Device Conference, paper CH1461-3/79, 0000-0385. Notched grooves as narrow as 1 micron are provided by anisotropic etching, IEEE Transactions Electron Device, Volume ED-25, #10, October 1978, and "UMOS Transistors on (110) Silicon", Ammar and Rogers, Transactions IEEE, ED-27, May 1980, pages 907-914.

An alternative configuration is the DMOS (double diffused metal oxide semiconductor) FET 24, FIG. 2. N+ starting material 26 has an n- epilayer 28 into which p and n+ diffusions form regions 30 and 32. FET channel region 34 is formed at the top major surface over which insulating layer 36 is deposited, followed by gate metalization 38. Upon application of a positive voltage on gate electrode 38 relative to source electrode 40, electrons in p type region 30 are attracted towards the gate and congregate at the top major surface to thus invert the conductivity type along channel region 34 to n type. Current thus flows from drain electrode 42 through regions 26 and 28 and then through channel region 34 and then through source region 32 to source electrode 40, as shown by dashed line.

In the VMOS, UMOS and DMOS devices, the p body and the n+ source diffusions are carried out through the same opening in a silicon dioxide covering layer. As a consequence, the active channel region in DMOS FETs is also controlled by the difference in the diffusion depths. Lateral penetration is about 80% that of the vertical depth.

Stability of the operating specifications in MOS devices involves control of their threshold voltages, i.e. the value of the gate voltage required to produce the onset of drain to source conduction. This parameter is strongly influenced by the surface conditions of the silicon just over the channel region and the purity of the silicon dioxide, $SiO_2$, such as layers 14, FIG. 1, and 36, FIG. 2. During the thermal growth of the oxide, hydrogen chloride is introduced into the system to act as a gettering agent, thus providing fairly pure material.

A particularly troublesome element is sodium because any Na+ ions in the oxide tend to reduce the threshold of n channel devices, and an overabundance of them can prevent turn-off altogether. If aluminum gate metal is placed directly onto the gate oxide, these ions, if present in the aluminum, can drift into the silicon dioxide and degrade the device performance. This is true for VMOS, UMOS, and DMOS devices.

If, however, the transistors are fabricated with a phosphorous rich polycrystalline silicon (polysilicon or poly-si) gate, the technology for these materials allows much purer gates to be constructed with much more stable thresholds. Examples of VMOS and DMOS (HEXFET) devices utilizing this technology are shown in FIGS. 3 and 4. FIG. 5 shows a top view of the structure of FIG. 4, illustrating the HEX outline. Gate electrode connections are attached along the edge of the wafer. The VMOS structure is classified as a vertical non-planar unit. The HEXFET structure is a vertical planar unit.

Another vertical planar unit is the SIPMOS structure shown in FIG. 6. An n- epitaxial layer 44 is grown on an n+ substrate 46, FIG. 7. The thickness and resistivity of epilayer 44 is determined by the breakover voltage versus ON state resistance compromise. Using standard photolithography techniques, a p+ layer 48 (boron) is driven into the epilayer approximately 2 to 3 microns. The wafer is then stripped of old silicon dioxide and a new extremely clean 50 to 60 nanometer silicon dioxide layer is grown, usually in an environment of hydrogen chloride. Polycrystalline silicon is then deposited on top of the wafer using the LPCVD (low pressure chemical vapor deposition) method. An n+ diffusion into the entire polysilicon layer is then performed to provide for the gettering action of the phosphorous against sodium ions and provide a means to reduce the resistivity of the gate material, although it will still be a factor of 3,000 higher than aluminum. The entire surface of the polysilicon-phosphorous (Si/P) layer is bombarded by ion implantation in order to intentionally damage the top surface. Photoresist material is placed on the Si/P, developed and etched. Since the top etches faster than the bottom, due to the damage, the taper shown in FIG.

8 results. By using this tapered gate arrangement, the subsequent implants are more uniform up to the silicon gate oxide surface.

A light, carefully controlled, ion implanted p region 52, FIG. 9, is now added, which will be the channel region. After implantation, a drive-in diffusion moves this layer about one micron below the wafer surface. No oxide masking is needed because the Si/P gate serves that function as mentioned above. An n+ source region 54 is now ion implanted through the same opening in the Si/P gate grid structure. The impurity density is selected such that p+ region 48 is greater than n+ source region 54, and the depth of n+ source region 54 is typically 0.4 microns. A heavy low temperature oxide layer 56, FIG. 6, is applied, followed by a pre-ohmic and ohmic aluminum step yielding drain electrode 58 and source electrode 60.

As noted above, almost all power MOSFET design has been concentrated on vertical configurations. An example of the other general class of MOSFETs, the lateral type, is shown in FIG. 11.

Lateral MOSFET 62 has a substrate including an n-epitaxial layer 64 into which are diffused p region 66, n+ source region 68 and n+ drain region 70. Upon application of a positive voltage on gate electrode 72 relative to source electrode 74, electrons in p region 66 are attracted to the top surface of the substrate to invert the conductivity type along channel region 76 to n type, whereby electrons flow from source 68 through channel 76 through drift region 80 to drain 70, and current thus flows from drain electrode 78 through channel 76 to source electrode 74. The principal advantage of lateral device 62 is ease of implementation in integrated geometries where all leads are accessible.

As with the previously mentioned vertical MOSFETs, the lateral MOSFET 62 of FIG. 11 is unidirectional.

It will be noted that each of the above references is to enhancement mode devices. Since the electron mobility is about 2.5 times greater than the hole mobility in silicon, the most common channel is n- type. The ON state channel resistance is determined by the degree to which one can enhance the initial conductivity of the semiconductor. Thus larger gate voltages generally produce lower ON state resistances. If the devices were constructed as depletion mode units, the ON state resistance occurring at zero gate signal would be fixed by the conductivity of the starting material. Little if any reduction in ON state resistance could be effected by application of gate voltage. Since the starting resistivity must be high in order to sustain high blocking voltages in the OFF state, the ON state resistance of depletion mode devices currently being fabricated is considered too large to be a serious contender in power FET development. From this perspective, since all current JFETs are depletion mode devices, JFET configurations have not been seriously considered for power switching applications.

DETAILED DESCRIPTION OF THE INVENTION

Reviewing FIGS. 1 through 11, it is seen that in each case the transistor will not support a reverse drain to source voltage. Each device is unidirectional in that only one junction drop separates drain and source when (for the n channel devices shown) the drain is negative with respect to the source. In many applications, these devices can be effectively employed. But if AC line voltage is to be the drain-source driving function, then a bidirectional design becomes mandatory. Again, inspection of the device geometries in FIGS. 1 through 11 shows that the reason for the unidirectional esign stems from the use of the device as a three terminal element, i.e. both the drain and the gate voltages are referenced to the common source point. It is necessary that the source electrode be in contact with the n+ source region and also with the p body region (to provide the gate return contact). Thus, the blocking action of the pn epijunction is negated.

Referring to FIG. 1, for example, if device 2 were supplied with a separate electrode for p region 8, and the source metalization 18 contacted only the n+ source region 10, a bidirectional FET would result. There would be considerable asymmetry due to unequal blocking capabilities of the n region 6 and p region 8. Likewise in FIG. 11, if a separate electrode is provided for p region 66 and if source metalization 74 contacted only source region 68, then a bidirectional FET would result, but there would be considerable asymmetry due to the unequal blocking capabilities of n region 64 and p region 66. Thus a new geometry and perhaps technology would be required.

The present invention evolved from efforts to provide bidirectionality in a power FET without having to overcome these immediately above noted difficulties. The present invention provides a simple yet effective power MOSFET structure avoiding these difficulties yet providing bidirectional current flow.

FIG. 12 schematically shows the split gate bidirectional lateral FET structure constructed in accordance with the invention. FET 102 includes a substrate 104 of semiconductor material of one conductivity type having a top major surface 106. In preferred form, substrate 104 is an n- epitaxial layer grown on a base layer of semiconductor material such as p layer 108. A silicon dioxide insulating layer 110 is grown on top major surface 106, followed by deposition of laterally spaced gate electrodes 112 and 114 through an appropriate mask, followed by a top silicon dioxide insulating layer 116.

A pair of p tub regions 118 and 120 are diffused into substrate 104 through holes 122 and 124 in the silicon dioxide insulating layer on top major surface 106. N+ regions 126 and 128 are diffused into respective p regions 118 and 120 through the same holes 122 and 124, respectively, in the oxide layer, comparably to the double diffusion process noted above. N+ region 126 is prevented from forming in the central section 130 of p region 118 by a separate masking step, or in accordance with the SIPMOS process noted above, and likewise for central section 132 of p tub 120. Both the p and the n+ diffusions are performed through the same hole, and thus the oxide edge 134 provides aligned registry. The diffusion parameters control the lateral penetration of p edge 136 and n+ edge 138, which in turn control the lateral length of channel region 140 formed therebetween, and likewise for channel region 142.

Split gate electrodes 112 and 114, insulatingly spaced above top major surface 106, extend across respective channels 140 and 142. There is no continuous gate electrode extending above and across central section 144 of substrate 104 which extends upwardly between the channel regions to top major surface 106. Metalizations 146 and 148 are deposited in openings 122 and 124 to ohmically contact respective source regions 126 and 128 and respective tub regions 118 and 120. Metalizations 146 and 148 provide the main electrodes for current flow through the device as controlled by gate electrodes 112 and 114.

Upon application of a positive voltage to gate electrode 112 with respect to source region 126 and main electrode 146, electrons in p region 118 are attracted to top major surface 106 to thus invert the conductivity type in channel region 140 to n type. If main electrode 148 is positive with respect to main electrode 146, current may then flow from p region 120 momentarily across forward biased pn junction 150 into drift region 144, then through channel 140 to source 126 and electrode 146. As soon as current starts to flow throuqh the FET, the voltage across the main electrodes drops, which in turn reduces the potential in the various regions of the FET, including portion 152 of p tub 120 below the other FET channel 142. Portion 152 thus becomes negative relative to gate 114, whereby positive gate 114 attracts electrons toward top major surface 106 to thus invert the conductivity of channel 142 to n type and hence render channel 142 conductive. Forward biased pn junction 150 thus conducts only momentarily until the second channel 142 turns ON. The main current path through FET 102 is from main electrode 148, through source region 128, through channel 142, through drift region or drain 144, through channel 140, through source 126 to main electrode 146.

The structure is bi-lateral, and thus current may also flow from main electrode 146 to main electrode 148 when gate 114 is positive with respect to source 128. Electrons in p region 120 are attracted to top major surface 106 by gate electrode 114 thereabove to thus invert channel region 142 to n type, and hence allow electron flow from n+ source 128 through channel 142 into drift region 144. If electrode 146 is positive with respect to electrode 148, current then flows from p region 118 momentarily across forward biased pn junction 136 until channel 140 turns ON. The main current path is thus from main electrode 146, through source 126, through channel 140, through drift region 144, through channel 142, through source 128 to main electrode 148.

In the absence of gate potential on electrodes 112 and 114, channel regions 140 and 142 are p type, and the device is in a blocking OFF state. Current from main electrode 146 to main electrode 148 is blocked by junction 150. Current flow in the other direction from main electrode 148 to main electrode 146 is blocked by junction 136. Drift region 144 in substrate 104 acts as a common drain for each side of the FET and withstands high voltage due to its large area, described more fully hereinafter.

The split gate electrodes 112 and 114 are adapted for application of an electrical potential for producing electric fields of sufficient intensity to invert the conductivity type in at least a portion of the channel regions 140 and 142. Upon application of voltage of either polarity to source regions 126 and 128, electric current can flow in a respective corresponding direction between them, under control of the electrical potential of the split gate electrode means. The channel regions 140 and 142 are laterally spaced by drift region 144 extending upwardly therebetween to top major surface 106 of the FET. Source regions 126 and 128 are laterally spaced along top major surface 106, and the channel regions 140 and 142 and the drift region 140 are disposed between the source regions 126 and 128. Channel regions 140 and 142 are part of respective tub regions 118 and 120 extending laterally a least partially around respective source regions 126 and 128. Main electrodes 146 and 148 are each connected to a respective source region and its respective tub region to ohmically short each respective source and channel region, e.g. source 126 and tub region 118 ohmically shorted by main electrode 146 in electrically conductive contact therewith.

Bidirectional FET 102 may be used to control AC power. FIG. 12 schematically shows a load 154 and a source of AC power 156 connected across main electrodes 146 and 148 of the FET. Gate electrodes 112 and 114 may be connected in common to a single gate terminal 158 which is connectable to a source of gate potential 160 through switch means 162. In the ON state of FET 102, switch 162 is in its upward position to connect terminal 158 to potential source 160 such that a given polarity potential is applied to each of gate electrodes 112 and 114. When main electrode 148 is positive with repect to main electrode 146, as driven by AC source 156, gate electrode 112 is positive with respect to source 126 and main electrode 146 connected to p region 118. Hence, channel 140 is inverted to n type and conduction occurs, i.e. current flows from positive main electrode 148 through source 128, throug channel 142, through drift region 144, through channel 140, throug source 126 to negative main electrode 146 and through load 154. In the other half cycle of the AC source 156, main electrode 146 is positive with respect to main electrode 148, whereby gate electrode 114 is positive with respect to source region 128 and p regon 120 connected to negtive main electrode 148. Conduction is thus enabled through channel 142, and current flows from positive main electrode 146 through source 126, through channel 140, through drift region 144, through channel 142, to source 128 and main electrode 148.

In preferred form, gate terminal 158 is referenced to one of the main electrodes 146 or 148 in the OFF state of device 102. This is desired in various circuit applications where it is convenient to have a common reference potential. In one embodiment, gate terminal 158 is tied to main electrode 146 when switch 162 is in its leftward position to thus connect gate terminal 158 through reverse blocking diode 164 to main electrode 146.

In the OFF state of FET 102, with gate 158 referenced through switch 162 and diode 164 to main electrode 146, FET 102 can withstand high voltages thereacross without going into conduction. For example, if the voltage on main electrode 148 swings positive with respect to main electrode 146, the voltage in substrate 104 likewise swings positive because of only a single voltage drop thereto across pn junction 150. The section 166 of substrate 104 beneath gate electrode 114 is thus positive with respect to electrode 114. Relative negative electrode 114 attracts holes in substrate section 166 toward top major surface 106 to thus invert the conductivity type of section 166 to p type and thus form a potential conductive channel. Another potential conductive channel 168 is formed in substrate section 168 below gate electrode 112. Potential conductive channels 166 and 168 do not meet each other because of the split gate structure and the physical laterally spaced separation of gate electrodes 112 and 114 preventing the formation of a potentially conductive channel along central section 170 in the substrate below top major surface 106.

In reverse direction of OFF state blocking voltage, with main electrode 146 swinging positive with respect to main electrode 148, gate electrodes 112 and 114 do not have the requisite relative negative potential with respect to the corresponding substrate regions and thus no potential conductive channels are formed.

FET 102 thus has a high OFF state voltage blocking capability, even with the gate electrodes referenced to one of the main electrodes. High OFF state voltage blocking capability may also be achieved by allowing the gate electrodes to float in the OFF state of FET 102.

FIG. 13 is like FIG. 12 and shows an alternative gating arrangement, and like reference numerals are used where appropriate to facilitate clarity. Gate electrodes 112 and 114 are not connected in common to a single gate terminal, but rather each has its own gating voltage source 172 and 174 each referenced to a respective main electrode 146 and 148. Gate electrode 112 is connected to a first gate terminal 176 which is connectable through switch 178 to gating voltage source 172, and in the FET OFF state is connectable to diode 180 to be referenced to main electrode 146. Gate electrode 114 is connected to a second gate terminal 182 which is connectable through switch 184 to gating voltage source 174, and in the FET OFF state to diode 186 to be referenced to main electrode 148.

Other gating arrangements and techniques are of course feasible, as is well recognized in the art. For example, the gate may be driven from the AC line power from source 156 through appropriate threshold and protective circuitry, or may be driven through synchronizing circuitry such as a phase lock loop from the AC line to be clocked at a given point in each cycle, or may be driven from an optically or otherwise isolated gate power source. One desirable type of gating arrangement is that shown in copending application Ser. No. 06/390,721, filed June 21, 1982 wherein a current source is connected to a common point between the FET gates, which common gate point is referenced through a resistor and a pair of diodes to the most negative of the main electrodes. The load and AC source may also be connected in a variety of manners, as known in the art, for example the AC source may be coupled to the FET through an isolation transformer.

FIGS. 14 through 16 show the preferred implementation of the schematic structure of FIG. 12. FIG. 14 is a top view of a semiconductor chip 202 having a plurality of bidirectional FETs integrated thereon in a matrix pattern or array. The main terminals 204 (T1) and 206 (T2), corresponding respectively to main electrodes 146 and 148 of FIG. 12, extend in interdigitated fashion by means of long narrow parallel terminal straps 204a and 206a to interconnect the plurality of FETs. Gate terminals 208 (G1) and 210 (G2), corresponding respectively to gate electrodes 112 and 114 of FIG. 12, are extended to each respective side and interconnect their various respective gate electrodes by means of a continuous waffle-like dual pattern.

FIG. 15 is an enlarged view of the correspondingly outlined section of FIG. 14. FIG. 16 is a cross-sectional view taken as shown in FIG. 15. A substrate 214 is provided by an n- epitaxial layer grown on a p type base layer 216. A plurality of p diffusions form p tub regions 218, 220, 222, and so on as defined by a waffle-like oxide pattern 224. The boundaries of these p tubs define a pluality of cells in the substrate such as shown in FIG. 15 at 218a, 220a, 222a, and so on. These cells are arranged in a plurality of rows and columns.

The n+ diffusion is carried out in the cells formed by the p tub regions to yield n+ source regions 226, 228, 230, and so on. The areas in FIG. 15 designated 232, 234, 236, and so on, are masked or otherwise processed (for example in accordance with the above noted SIPMOS process) to prevent n+ diffusion thereunder and/or a p+ diffusion is then carried out thereunder to yield p+ regions 238, 240, 242, and so on, FIG. 16, which are continuously crystalline with the corresponding p tub regions and extend upwardly to top major surface 244.

A polysilicon dual gate matrix forms split gate electrode patterns 208a and 210a, FIG. 15, with electrodes 208a connected in common, for example by a top crossing strap (not shown) extended out to the left to provide the G1 gate terminal 208, and with electrodes 210a connected in common, for example by a lateral strap extending left to right across the bottom and brought out rightwardly to provide the G2 gate terminal 210. An insulating silicon dioxide layer 246 covers the gate matrix. Apertures 248, 250, 252, and so on, through which the diffusions are performed also receive deposited main terminal strap metalizations to yield main terminal electrode 204a ohmically contacting source region 226 and p tub region 218, and main terminal electrode 206a ohmically contacting source regions 228 and p tub region 220.

Upon application of a positive voltage at gate electrode 208a with respect to source region 226, electrons in p tub region 218 are attracted to the top major surface 244 beneath gate electrode 208a. This inverts the conductivity type along channel region 254 to n type such that electrons may flow from source 226 through channel 254 into drain or drift region 256 which is a section of substrate 214 extending upwardly to top major surface 244 between p tubs 218 and 220. If the T2 main electrode terminal 206a is positive with respect to the T1 main terminal electrode 204a, then current can flow from p region 220 momentarily across forward biased pn unction 258 into drift region 256 and through channel region 254 to source 226 and terminal 204a. As before, as soon as current starts to flow through the FET, the voltage across the main terminals drops, which in turn reduces the potential in the various regions of the FET, including the portion 261 of p tub 220 below channel 260. Portion 261 thus becomes negative relative to gate 210a, whereby positive gate 210a attracts electrons towards top major surface 244 to thus invert the conductivity of channel 260 to n type and hence render channel conductive. Forward biased pn junction 258 thus conducts only momentarily until the second channel 260 turns ON. The main current path through the FET is from main electrode 206a, through source 228, through channel 260, through drift region 256, through channel 254, through source 226 to main electrode 204a. Current flows in the reverse direction along the same path when main electrode 204a is positive with respect to main terminal 206a.

Each of the cells 218a, 220a, 222a, and so on, in the matrix has a right portion forming a lateral FET in combination with a left portion of the next adjacent cell to the right in the same row. Correspondingly, each cell has a left portion forming a lateral FET in combination with the right portion of the next adjacent cell to the left in the same row. For example, 220a has a right portion 221, FIG. 16, forming a lateral FET 262 with a left portion 223 of cell 222a. Also, cell 220a has a left portion 225 forming a lateral FET 264 with a right portion 227 of cell 218a. Each of the FETs 262 and 264 is bidirectional.

As seen in FIG. 16, each cell, e.g. cell 220a, has a p tub region in substrate 214 extending laterally and then upwardly to top major surface 244 to form right and left boundaries defining right and left junctions, e.g. 258 and 266 with substrate 214. Source region 228 has right and left portions extending laterally and then upwardly to top major surface 244 to define right and left junctions 268 and 270 with the right and left upward extensions of tub region 220. The right and left upward extensions of tub region 220 form right and left FET channels 260 and 272 immediately below top major surface 244. The right and left portions of source region 228 also extend laterally towards each other and then upwardly to top major surface 244 such that intermediate portion 240 of tub region 220 extends upwardly to top major surface 244 between the right and the left portions of source region 228. As seen in FIG. 15, the channel regions are part of respective tub regions extending laterally at least partially around respective source regions.

Main electrode 206a ohmically interconnects upwardly extending intermediate tub region portion 240 with the intermediate tub region portion of alternate cells. The other main electrode 204a ohmically interconnects upwardly extending intermediate tub region portion 238 with the remaining staggered set of alternate cells, as seen in FIG. 15. Gate electrodes 208a and 210a are insulated above top major surface 244 by oxide 224 in a waffle-like or matrix pattern. Each respective split gate electrode portion 208a and 210a overlies and extends across a respective FET channel. Gate electrode 208a overlies and extends across the right FET channel, such as 254, of a left cell. Gate electrode 210a overlies and extends across the left FET channel such as 260, of a right cell.

The upwardly extending portions of the substrate such as 256 beneath the split gate electrode array likewise form a waffle-like pattern separating the rows and columns of the cells in the matrix array. The intermediate tub region portions, such as 240, are offset to the right or the left of center in their respective cells such that the main electrode connection point is likewise offset to the right or left in each cell.

In a first row of cells, for example row 274, FIG. 15, each cell has a main electrode connection point to the left of center to thus have a left-hand orientation. In a second row of cells, for example row 276, each cell has a main electrode connection point to the right of center to thus have a right-hand orientation. The main electrodes 204a and 206a extend in column form perpendicular to the rows, FIG. 15. As above noted and seen in FIG. 14, the main electrode terminal straps extend parallel to each other in interdigitated manner. Each strap is wide enough to straddle portions of adjacent cells as shown in FIG. 15 by T1 strap 204a straddling cells 218a and 220a. Each strap is insulated above the split gate electrodes by silicon dioxide layer 246, FIG. 16. As seen in FIG. 15, main terminal strap 204a ohmically contacts left-hand oriented cell 278 thereneath at area 280 in first row 274, and then ohmically contacts right-hand oriented cell 218a at area 248 therebeneath in second row 276, and so on.

The plurality of bidirectional FETs formed by the cells are thus connected in parallel between the main terminals 204 and 206, FIG. 14. In one implementation, chip 202 is 125 mils by 125 mils and contains 2,580 cell pairs. Each cell is 55 microns long by 20 microns wide. The p tub regions, such as 220, are diffused to a depth of approximately 3 microns, and the n+ source regions, such as 228, are diffused to a depth of about 1 micron. The resistance of the device in the ON state is extremely low due to the high packing density affording a large number of FETS per unit area.

It is recognized that various modifications are possible within the scope of the appended claims.

We claim:

1. A bidirectional FET, comprising in a semiconductor substrate:
   a first source region of one conductivity type semiconductor material;
   a first channel region of opposite conductivity type semiconductor material forming a junction with said first source region;
   a single drift region of said one conductivity type semiconductor material forming another junction with said first channel region;
   a second channel region of opposite conductivity type semiconductor material forming a junction with said drift region;
   a second source region of said one conductivity type semiconductor material forming a junction with said second channel region; and
   split gate electrode means comprising a first gate electrode disposed proximate said first channel region and a second gate electrode disposed proximate said second channel region, and adapted for application of an electrical potential for producing electric fields of sufficient intensity to invert the conductivity type in at least a portion of said first and second channel regions;
   said single drift region forming first and second PN junctions with respective said first and second channel regions, said first and second source regions forming third and fourth PN junctions with respective said first and second channel regions;
   a first main electrode contacting said first source region and said first channel region;
   a second main electrode contacting said second source region and said second channel region;
   a source of alternating voltage impressed across said first and second main electrodes such that during the first half cycle of said alternating voltage said first PN junction is a forward biased junction and said second PN junction is a reverse biased junction, and such that during the second half cycle of said alternating voltage said second PN junction is a forward biased junction and said first PN junction is a reverse biased junction;
   a first gating voltage source connected to said first gate electrode in said second half cycle of said alternating voltage to create a first inversion channel region between said single drift and said first source region to short the otherwise blocking reverse biased said first PN junction during said second half cycle of said alternating voltage such that current flows through said FET from said second main electrode to said first main electrode during said second half cycle of said alternating voltage;
   a second gating voltage source connected to said second gate electrode in said first half cycle of said alternating voltage to create a second inversion channel region between said single drift region and said second source region to short the otherwise blocking reverse biased said second PN junction during said first half cycle of said alternating voltage such that current flows through said FET from said first main electrode to said second main electrode during said first half cycle of said alternating voltage;

said FET having an OFF state in the absence of said gating electrical potential from said first and second gating voltage sources, said single drift region supporting OFF state blocking voltage in both directions, and wherein said first and second gate electrodes are at non-common potentials in said OFF state.

2. The invention according to claim 1 wherein:
said channel regions are laterally spaced by said drift region extending upwardly between said channel regions to a top major surface of said FET;
said first gate electrode extends laterally along said top major surface and is spaced thereabove by a layer of insulation, said first gate electrode extending across said first channel region; and
said second gate electrode extends laterally along said top major surface and is spaced thereabove by a layer of insulation, said second gate electrode extending across said second channel region and laterally spaced from said first gate electrode.

3. A bidirectional laterally integrated power switching plural FET structure, comprising:
a substrate of semiconductor material of one conductivity type having a top major surface;
a first tub region of the other conductivity type in said substrate along said to top major surface;
first and second source region portions of said one conductivity type in said first tub region laterally spaced along said top major surface;
a second tub region of said other conductivity type in said substrate laterally spaced from said first tub region along said top major surface;
third and fourth source region portions of said one conductivity type in said second tub region laterally spaced along said top major surface;
a first singular drift region of said one conductivity type formed by said substrate between said first and second tub regions and forming a junction with said first tub region and forming a junction with said second tub region, said first singular drift region supporting OFF state blocking voltage in both directions to substantially reduce total drift region depletion path length otherwise required for two back-to-back drift regions each supporting blocking voltage respectively in one direction only, whereby to afford substantially increased lateral packing density and in turn more FETs and even higher power capability per unit lateral area;
third, fourth and so on, tub regions in said substrate, having fifth and sixth, seventh and eighth, and so on, source region portions, and second and so on singular drift regions therebetween;
a first gate electrode insulatingly spaced above said top major surface and extending across the section of said first tub region between said second source region portion and said substrate;
a second gate electrode insulatingly spaced above said top major surface and extending across the section of said second tub region between said substrate and said third source region portion;
a third gate electrode insulatingly spaced above said top major surface and extending across the section of said second tub region between said fourth source region portion and said substrate;
a fourth gate electrode insulatingly spaced above said top major surface and extending across the section of said third tub region between said substrate and said fifth source region portion;
fifth, sixth, and so on, gate electrodes;
a first main electrode ohmically connected to said first and second source region portions and the section of said first tub region therebetween;
a second main electrode ohmically connected to said third and fourth source region portions and the sections of said second tub region therebetween;
third, fourth, and so on, main electrodes;
said section of said first tub region between said second source region portion and said substrate comprising a first channel region along said top major surface, and said section of said second tub region between said substrate and said third source region portion comprising a second channel region along said top major surface;
said section of said second tub region between said fourth source region portion and said substrate comprising a third channel region, and said section of said third tub region between said substrate and said fifth source region portion comprising a fourth channel region;
said first singular drift region forming first and second PN junctions with respective said first and second channel regions, said second and third source regions forming third and fourth PN junctions with respective said first and second channel regions;
said second singular drift region forming fifth and sixth PN junctions with respective said third and fourth channel regions, said fourth and fifth source regions forming seventh and eighth PN junctions with respective said third and fourth channel regions;
first gate terminal means ohmically interconnecting said first, third, fifth and so on gate electrodes;
second gate terminal means ohmically interconnecting said second, fourth, and so on gate electrodes;
first main terminal means ohmically interconnecting said first, third, fifth, and so on main electrodes;
second main terminal means ohmically interconnecting said second, fourth, and so on main electrodes;
a source of alternating voltage impressed across said first and second main terminal means such that during the first half cycle of said alternating voltage said first and fifth PN junctions are forward biased junctions and said second and sixth PN junctions are reverse biased junctions, and such that during the second half cycle of said alternating voltage said second and sixth PN junctions are forward biased junctions and said first and fifth PN junctions are reverse biased junctions;
a first gating voltage source connected to said first gate terminal means in said second half cycle of said alternating voltage to create a first inversion channel region between said first singular drift region and said second source region to short the otherwise blocking reverse biased said first PN junction during said second half cycle of said alternating voltage, and to create a second inversion channel region between said second singular drift region and said fourth source region to short the otherwise blocking reverse biased said fifth PN junction during said second half cycle of said alternating voltage, such that current flows from said second main terminal means and the even numbered said main electrodes through said FET to the odd numbered said main electrodes and said first main terminal means during said second half cycle of said alternating voltage;

a second gating voltage source connected to said second gate terminal means in said first half cycle of said alternating voltage to create a third inversion channel region between said first singular drift region and said third source region to short the otherwise blocking reverse biased said second PN junction during said first half cycle of said alternating voltage, and to create a fourth inversion channel region between said second singular drift region and said fifth source region to short the otherwise blocking reverse biased said sixth PN junction during said first half cycle of said alternating voltage such that current flows from said first main terminal means and the odd numbered said main electrodes through said FET to the even numbered said main electrodes and said second main terminal means during said first half cycle of said alternating voltage;

said FET having an OFF state in the absence of said gating electrical potential from said first and second gating voltage sources, each of said singular drift regions supporting OFF state blocking voltage in both directions, and wherein said first and second gate terminals are at non-common potentials in said OFF state.

4. An integrated plural lateral FET structure for bidirectional power switching, comprising:

a semiconductor chip comprising a substrate of one conductivity type;

a plurality of laterally spaced cells forming a matrix array on said substrate along a top major surface thereof;

each said cell having a right-hand portion forming a lateral FET in combination with the left-hand portion of the next adjacent cell to the right;

each cell having a left-hand portion forming a lateral FET in combination with the right-hand portion of the next adjacent cell to the left;

a plurality of singular drift regions of said one conductivity type each formed by said substrate between respective said cells;

each cell comprising:

a tub region of opposite conductivity type in said substrate and extending laterally and then upwardly to said top major surface to form right and left boundaries defining right and left junctions with said substrate;

source region means of said one conductivity type in said tub region and having right and left portions extending laterally and then upwardly to said top major surface to define right and left junctions with said right and left upward extensions of said tub region;

said right and left upward extensions of said tub region forming right and left FET channels immediately below said top major surface;

said right and left source region portions also extending laterally towards each other and then upwardly to said top major surface such that an intermediate portion of said tub region extends upwardly to said top major surface between said right and left source region portions;

first main electrode means ohmically interconnecting said upwardly extending intermediate tub region portion and said right and left source region portions at said top major surface with the intermediate tub region portion and right and left source region portions of alternate cells;

second main electrode means ohmically interconnecting said upwardly extending intermediate tub region portions and right and left source region portions of the remaining alternate cells;

split gate electrode means insulated above said top major surface of said substrate in a waffle-like pattern, comprising a first gate electrode overlying and extending across said right FET channel of a left cell, and a second gate electrode laterally spaced from said first gate electrode and extending across said left FET channel of a right cell, said upwardly extending portion of said substrate beneath said gate electrode means likewise forming a waffle-like pattern separating the rows and columns of said cells in said matrix array;

each of said singular drift regions forming a first PN junction with said right FET channel of the cell to the left and forming a second PN junction with the left FET channel of the cell to the right, said right source region of said left cell forming a third PN junction with said right FET channel of said left cell, and said left source region of said right cell forming a fourth PN junction with said left FET channel of said right cell;

a source of alternating voltage impressed across said first and second main electrode means such that during the first half cycle of said alternating voltage said first PN junction is a forward biased junction and said second PN junction is a reverse biased junction, and such that during the second half cycle of said alternating voltage said second PN junction is a forward biased junction and said first PN junction is a reversed biased junction;

a first gating voltage source connected to said first gate electrode in said second half cycle of said alternating voltage to create a first inversion channel region between said singular drift region and said right source region of said left cell to short the otherwise blocking reverse biased said first PN junction during said second half cycle of said alternating voltage such that current flows from said second main electrode means through said left portion of said right cell then through said singular drift region then through said right portion of said left cell to said first main electrode means during said second half cycle of said alternating voltage;

a second gating voltage source connected to said second gate electrode in said first half cycle of said alternating voltage to create a second inversion channel region between said singular drift region and said left source of said right cell to short the otherwise blocking reverse biased said second PN junction during said first half cycle of said alternating voltage such that current flows from said first main electrode means through said right portion of said left cell then through said singular drift region then through said left portion of said right cell to said second main electrode means during said first half cycle of said alternating voltage;

said FET having an OFF state in the absence of gating electrical potential from said first and second gating voltage sources, each said singular drift region supporting OFF state blocking voltage in both directions to substantially reduce total drift region depletion path length otherwise required for two back-to-back drift regions each supporting blocking voltage respectively in one direction only, and wherein said first and second gate electrodes are at non-common potentials in said OFF state.

5. The invention according to claim 4 wherein said upwardly extending intermediate tub region portion is offset to the right or left of center in said cells such that said main electrode connection point is likewise offset to the right or left in each cell;

in a first row of cells, each cell having said main electrode connection point to the left of center to thus have a left-hand orientation;

in the second row of cells, each cell having said main electrode connection point to the right of center to thus have a right-hand orientation.

6. The invention according to claim 5 wherein said first and second main electrode means extend in column form perpendicular to said rows, said first and second main electrode means extending parallel to each other in interdigitated manner by means of a plurality of terminal straps, each strap extending perpendicularly across said rows and being wide enough to straddle portions of adjacent cells in each row, each strap insulated above said gate electrode means, a given strap ohmically contacting a left-hand oriented cell therebeneath in a first row and then ohmically contacting a right-hand oriented cell therebeneath in the second row, and so on.

* * * * *